United States Patent [19]

Roozenbeek et al.

[11] 4,159,431
[45] Jun. 26, 1979

[54] ELECTRONIC SWITCH MAINTAINING A PREDETERMINED STATE INDEPENDENT OF SUPPLY VOLTAGE VARIATION

[75] Inventors: Herman Roozenbeek, Schwieberdingen; Werner Jundt, Ludwigsburg, both of Fed. Rep. of Germany

[73] Assignee: Robert Bosch GmbH, Stuttgart, Fed. Rep. of Germany

[21] Appl. No.: 869,484

[22] Filed: Jan. 16, 1978

[30] Foreign Application Priority Data

Feb. 18, 1977 [DE] Fed. Rep. of Germany ....... 2706935

[51] Int. Cl.$^2$ .......................... H03K 3/295; H03K 1/02
[52] U.S. Cl. ................................ 307/290; 307/296 R; 328/203
[58] Field of Search ................ 307/290, 296; 328/203, 328/206, 217

[56] References Cited

U.S. PATENT DOCUMENTS

| 3,131,314 | 4/1964 | Charlot, Jr. ........................... 307/290 |
| 3,604,945 | 9/1971 | Hoffman et al. .................. 307/290 X |

Primary Examiner—John Zazworsky
Attorney, Agent, or Firm—Frishauf, Holtz, Goodman & Woodward

[57] ABSTRACT

To prevent uncontrolled switching of a Schmitt trigger during supply voltage shutoff, the trigger input transistor is maintained in the conductive state independent of supply voltage by a voltage divider and an additional DC base voltage. A second voltage divider furnishes a voltage blocking the output transistor of the Schmitt trigger after the supply voltage sinks too low to maintain conduction of the first transistor. A first and second so constructed Schmitt trigger is connected, respectively, to the first and second output of a difference amplifier. The inputs of the difference amplifier are connected to a pulse generator. Since the DC operating point of the difference amplifier changes with supply voltage, a controllable current source is connected to the difference amplifier for opposing the changes in the operating point. The controllable current source is controlled by the output signal from a summing and comparator circuit which has a first set of inputs connected to the outputs of the difference amplifier and a reference input.

15 Claims, 5 Drawing Figures

DIFFERENCE AMPLIFIER

PULSE GENERATOR — 20
— 21
— 22
— 23
SCHMITT TRIGGERS
— 24
SUMMING & COMPARATOR CIRCUIT
— 25
R    R

Fig. 4

ELECTRONIC SWITCH MAINTAINING A PREDETERMINED STATE INDEPENDENT OF SUPPLY VOLTAGE VARIATION

The present invention relates to electronic switching circuit and, particularly, to the type of switching circuit known as a Schmitt trigger circuit. It further relates to circuits wherein an electronic switching circuit is connected to the output of a difference amplifier and wherein the operating point of the difference amplifier varies as a function of supply voltage.

BACKGROUND AND PRIOR ART

From the publication of U. Tietze, and Ch. Schenk, Halbleiterschaltungstechnik, second edition 1971, page 415 and page 305, Schmitt trigger circuits are known in which besides the normal input signal (switching signal) an additional signal is applied in order to change the point at which the circuit switches. This arrangement has the disadvantage that the output state of the Schmitt trigger changes for decreasing supply voltage even though no switching signal is applied to its input. Further it is of course known to use difference amplifiers for amplification of electronic signals. However, the known difference amplifiers have supply current sources which supply a constant current. This has the disadvantage that, for decreasing supply voltages, the operating point of the difference amplifier will decrease to lower values and therefore cause subsequent switching circuits (for example Schmitt trigger circuits) to switch in an uncontrolled manner during such decreases of the supply voltage.

It is an object of the present invention to maintain the output transistor of the Schmitt trigger circuit in a blocked state, independent of the supply voltage value. The blocked state is to be maintained even when the supply voltage decreases substantially below the nominal supply voltage as, for example, is the case when the supply voltage is disconnected from the system.

SUMMARY OF THE INVENTION

Briefly, the present invention relates to a Schmitt trigger which has means for furnishing a supply voltage and an input amplifier element connected thereto. The input amplifier element has a conductive and a nonconductive state in the absence and presence of a switching signal applied thereto. The Schmitt trigger further has an output amplifier element connected to said input amplifier element in such a manner that the output amplifier element has a conductive and a nonconductive state when said input amplifier element is in said nonconductive and conductive states, respectively, and said supply voltage is substantially equal to a nominal supply voltage. First biasing means are applied to said input amplifier element for maintaining said input amplifier element in said conductive state in the absence of said switching signal, when said supply voltage decreases from said nominal supply voltage to a critical voltage at which uncontrollable switching would normally occur. Second biasing means are connected to said output amplifier element for maintaining said output amplifier element in said nonconductive state in the absence of said switching signal even when said supply voltage decreases below said predetermined voltage.

a difference amplifier is furnished which has a first and second output connected to a first and second switching circuit respectively. The inputs to the differential amplifier receive input pulses. The outputs of the difference amplifier are connected to inputs of a summing and comparator circuit. The summing and comparator circuit also receives a reference signal. The output of the summing and comparator circuit controls the amplitude of current furnished by a controllable current furnishing means to the difference amplifier. The so-supplied current is controlled to oppose changes in the operating point of the difference amplifier due to changes in the supply voltage.

The invention will be described by way of example with reference to the accompanying drawings, wherein:

FIG. 3 is a block diagram of an embodiment of the present invention utilizing a difference amplifier;

FIG. 4 is a more detailed circuit diagram of a portion of the circuits shown in FIG. 3;

Figure 1:
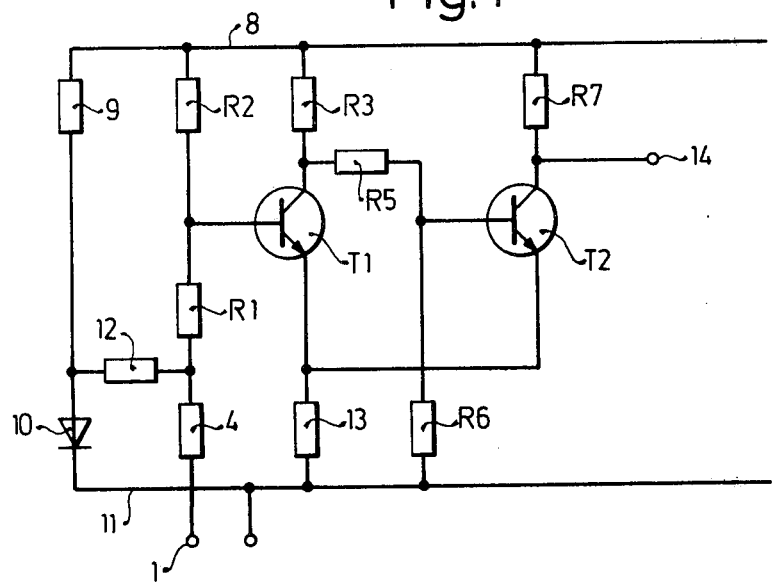
FIG. 1 is a circuit diagram of the Schmitt trigger circuit in accordance with the present invention.

The Schmitt trigger circuit shown in FIG. 1 has an input terminal, 1. The switching signal is applied between terminal 1 and ground potential. Terminal 1 is connected through a resistor 4 and a resistor R1 to the base of a transistor $T_1$. A further resistor $R_2$ is connected from the base of transistor $T_1$ to the line, 8, which furnishes the supply voltage. A resistor 9 is interconnected between line 8 and the anode of a diode 10 whose cathode is connected to line 11 which is at ground potential. A resistor 12 is connected from the anode of diode 10 to the common point of resistors 4 and $R_1$. The collector of transistor $T_1$ is connected through a resistor $R_3$ to line 8 and through a resistor $R_5$ to the base of a transistor $T_2$. The base of transistor $T_2$ is connected through a resistor $R_6$ to ground potential. The emitter of transistor $T_1$ is connected to the emitter of transistor $T_2$ and through a resistor 13 to line 11. The collector of transistor $T_2$ is connected through a resistor $R_7$ to line 8. A terminal 14 is connected to the collector of transistor $T_2$. Terminal 14 is the output terminal of the Schmitt trigger.

Figure 2:
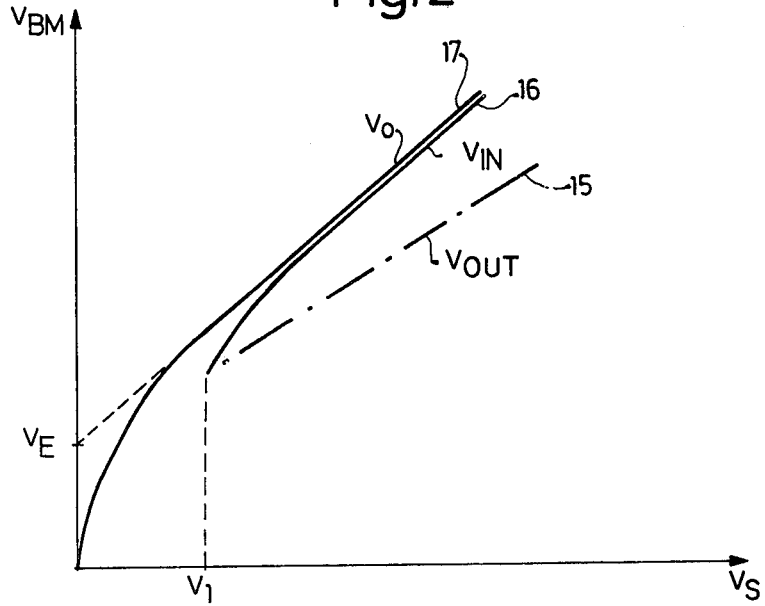
FIG. 2 shows characteristic curves of base voltage as a function of supply voltage for transistor T1 of FIG. 1.

The operation of the above described circuit will be discussed in detail with reference also to FIG. 2. FIG. 2 shows the characteristic curves of base to ground voltage of transistor $T_1$ as a function of supply voltage $V_s$. Characteristic curve 15 is a plot of the switch-out voltage of the Schmitt trigger, that is transistor $T_2$ is in the conductive state for $V_{BM}$ less than $V_{out}$. Line 16 is the characteristic curve of the switch-in level of the Schmitt trigger, that is transistor $T_2$ is blocked for $V_{BM}$ greater than $V_{in}$. The slope and shape of the characteristic curve are determined by the transistors and resistors used in the circuit. When the supply voltage decreases below a predetermined (critical) value $V_1$ the Schmitt trigger cannot function, since the triggering conditions are no longer fulfilled and the characteristic switch-out and switch-in curves (15, 16) intersect each other. If the circuit is not stabilized by other means, the base voltage $V_{BM}$ quickly enters the region between switch-out curves 15 and switch-in curve 16 with decreasing supply voltages and may even fall below switch-out characteristic 15. As a result, the output of the Schmitt trigger will switch in an uncontrolled fashion even for small variations in supply voltage and independent of the absence and presence of a signal at input 1.

In accordance with the invention, the base of transistor 1 receives a bias such that the base voltage $V_{BM} = V_O$ of transistor 1 will always be above the switch-in characteristic curve 16. This is shown in characteristic curve 17. In order to achieve this characteristic, resistors $R_1$ and $R_2$ which are the main resistors of the base voltage divider of transistor $T_1$ are so dimensioned that the base voltage of transistor $T_1$ will not fall below the corresponding value on the switch-in characteristic 16 for a wide range of supply voltage. Resistors $R_1$ and $R_2$ are therefore chosen to fulfill the following relationship:

$$R_1/(R_1+R_2) = a$$

where a is the slope of the switch-in characteristic curve 16. It is further necessary that an additional bias $V_E$ be applied to the base of transistor $T_1$ to shift characteristic curve 17 by the value $V_E$ at the zero point. The desired shift is achieved by an additional DC voltage supplied to the input of transistor $T_1$. In FIG. 1, this additional voltage is the voltage across diode 10 while the diode is in the conductive state. This voltage is coupled to the base circuit of transistor $T_1$ by a resistor 12. Resistor 9 serves to limit the current through diode 10. The DC voltage could also be supplied by an external source. The important thing is that characteristic curve 17 is above characteristic curve 16, causing transistor $T_1$ to be conductive as long as no switching signal is present at terminal 1.

Uncontrolled switching of transistor $T_2$ is also to be prevented when the supply voltage $V_s$ drops below the critical voltage $V_1$, that is when the switch-in characteristic 16 and the switch-out characteristic 15 intersect. Therefore the base voltage divider of transistor $T_2$ is so designed that transistor $T_2$ will remain blocked even when transistor $T_1$ can no longer be held in the conductive state, namely for supply voltages below voltage $V_1$. Specifically, the voltage at the base of transistor $T_2$ may not exceed the base-emitter voltage $V_{BET2}$ of transistor $T_2$ for supply voltages equal to or less than voltage $V_1$. Here $V_{BET2}$ refers to the base-emitter voltage required to cause transistor $T_2$ to become conductive at the then present supply voltage. Resistors $R_3$, $R_5$ and $R_6$ must therefore satisfy the following inequality:

$$R_6/(R_3+R_5+R_6) \cdot V_1 V_{BET2};$$

Under these conditions transistor $T_2$ cannot switch independent of supply voltage, if no signal is present at input 1. The Schmitt trigger can only be switched by a negative pulse applied to input 1. The term "negative pulse" here means a pulse which creates a level at the base of transistor $T_1$ which is negative with respect to the level in the absence of the pulse. Thus, for supply voltages ranging from the voltage $V_1$ to the nominal supply voltage, the Schmitt trigger circuit will switch when the level at the input is less than the switch-out level specified by characteristic curve 15. This operation is well known and need not be further described here.

FIG. 3 is a block diagram showing an electrical switching circuit with amplification. A pulse generator 20, which may for example be a Hall generator or an induction generator, furnishes pulses to a difference amplifier 21 whose outputs may each be connected with a Schmitt trigger 22 and 23 of the type described above. The outputs of the difference amplifier are further applied to the inputs of a summing and comparator circuit 24, whose output in turn is applied to the control input of a controllable current source 25. Current source 25 is interconnected between ground potential and the difference amplifier 21. The summing and comparator circuit 24 controls the current from current source 25 in such a manner that changes in the DC operating point of difference amplifier 21 due to changes in the supply voltage are compensated. The above circuit will be described in greater detail with reference to FIG. 4.

FIG. 4 shows a difference amplifier which is energized by a controllable current source. A first input of the difference amplifier is connected to the base of a transistor 30 and a second input to the base of a transistor 31. The collector of transistor 30 is connected through a resistor 32 to the voltage supply line 33 and directly to the base of a transistor 34. The collector of transistor 31 is directly connected to the base of a transistor 36 and through a resistor 35 to line 33. Resistors 32 and 35 may be temperature-varying resistors. The collectors of transistors 34 and 36 are directly connected to line 33. The emitter of transistor 34 is connected through a resistor 37 and a resistor 38 to ground potential. Similarly, the emitter of transistor 36 is connected to ground potential through resistors 39 and 40. Two further resistors 41 and 42 are interconnected between the emitter of transistor 34 and the collector of a transistor 43. Resistors 44 and 45 are connected between the emitter of transistor 36 and the collector of a transistor 46. The base of transistor 43 is connected through a resistor 37 to the emitter of transistor 34 and through a resistor 38 to ground potential. The emitters of transistors 43 and 46 are connected in common through a resistor 47 to ground potential. A common point of resistors 41 and 42 is connected through a resistor 48 to the summing point 50. Similarly, the common point of resistors 44 and 45 is connected through a resistor 49 to point 50. Summing point 50 is connected through a diode 51 and a resistor 52 to ground potential. Further, a resistor 53 is interconnected between summing point 50 and the base of a transistor 54 whose collector is connected through a resistor 55 to line 33. The emitter of transistor 54 is connected to ground potential through a resistor 56 and to the supply line 33 through a resistor 57. The collector of transistor 54 is connected to ground potential through a resistor 58 and 59. The base of a transistor 60 is connected to the common point of resistors 58 and 59. The collector of transistor 60 is directly connected to line 33. The emitter of transistor 60, together with the emitter of a transistor 61, are connected to ground potential through a resistor 62. The base of transistor 61 is connected to ground potential through a resistor 63 and to the positive supply line 33 through a resistor 64. The collector of transistor 61 is connected to the variable arm of a potentiometer 65. The end terminals of potentiometer 65 are connected to the emitters of transistors 30 and 31 respectively.

Figure 5:
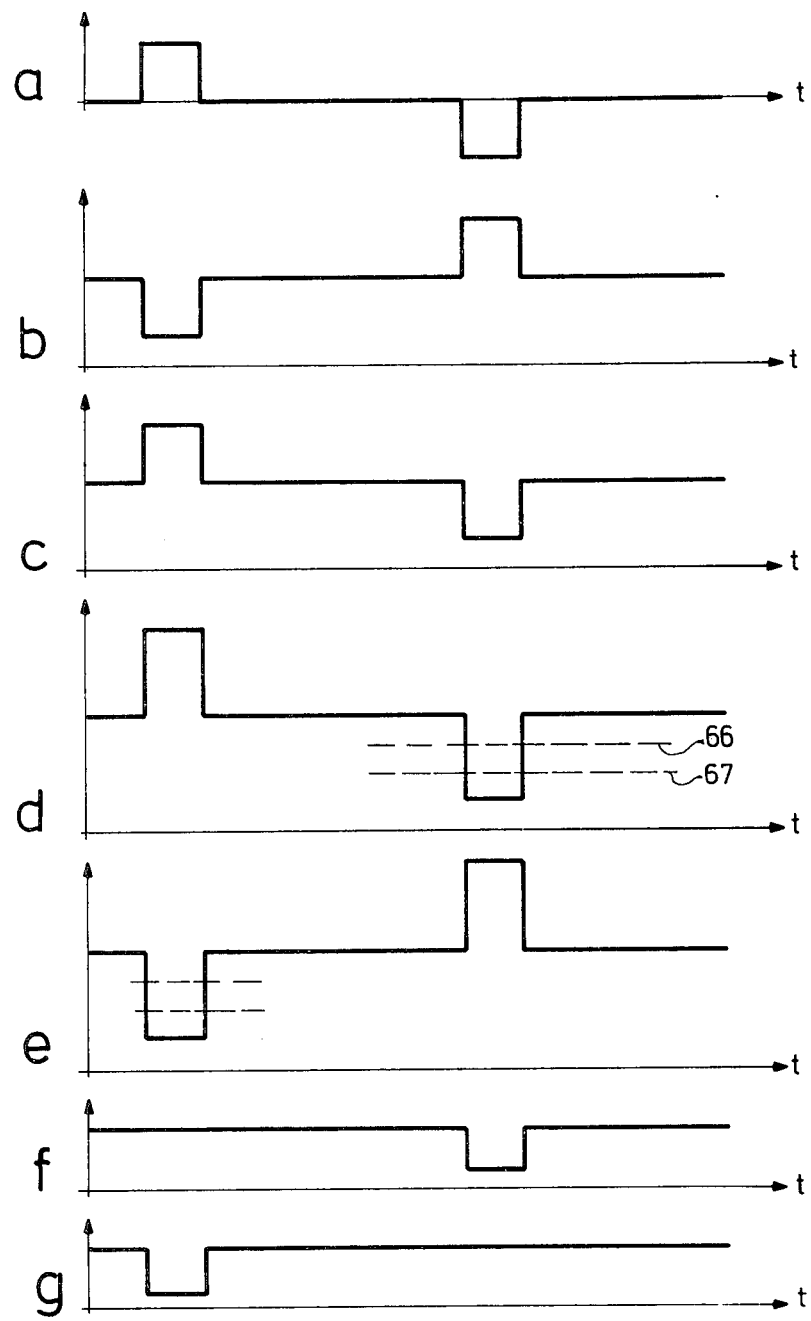
FIG. 5a–5g show voltage variations with respect to time at selected points in the circuit of FIGS. 3 and 4.

The operation of the circuit of FIG. 4 will be explained with reference also to FIG. 5. Pulse generator 20, for the preferred embodiment, furnishes a sequence of pulses shown in FIG. 5a. These are amplified and applied to transistors 34 and 36. The signal at the base of transistor 34 is shown in FIG. 5b, that at the base of transistor 36 in FIG. 5c. After impedance change, the signals are further amplified by transistors 43 and 46. The signal at the collector of transistor 43 is shown in FIG. 5d, that at the collector of transistor 46 in FIGS.

5e. For a fixed supply voltage, the dashed lines in FIGS. 5d and 5e indicate the switch-in voltage 66 and the switch-out voltage 67 of the Schmitt trigger circuits 22 and 23. The signals furnished by Schmitt triggers 22 and 23 is shown in FIGS. 5f and 5g respectively. The general operation of difference amplifiers is described in many text books, for example on pages 13–95 of the "Electronics Engineers' Handbook" by Fink first edition, McGraw Hill, Inc. 1975. If, for example, the supply voltage decreases, the operating point at the bases of transistors 34 and 36 drops to a lower voltage value, since the current furnished by transistors 61 and 60 remains constant. However, the decrease of voltage at the bases of transistors 34 and 36 causes a similar decrease at the bases of transistors 43 and 46. A decreasing base bias voltage, however, causes an increase in the DC collector voltage which appears at the output of the difference amplifier. In many applications it is, however, desirable to maintain a constant DC collector output voltage for maintaining the correct switching levels. For this purpose, a fraction of the voltage existing at the common point of resistors 41 and 42 and that of resistors 44 and 45 is applied through resistors 49 and 48 to the summing point 50. This causes a DC voltage to appear at point 50. As reference to FIGS. 5d and 5e will show, the summing process causes the voltage at the summing point to remain constant even during the time of the pulses, since the voltages at the emitters of transistors 34 and 36 are of opposite phase. However, the voltage at summing point 50 decreases with decreasing supply voltage. This decrease is achieved by letting resistors 41 and 44 be small in ohmic value relative to the ohmic value of resistors 42 and 45.

The circuit will also be operative if resistors 41 and 44 are directly connected to line 33 instead of being connected to the emitters of transistors 34 and 36. In that case, it is advantageous to connect resistors 48 and 49 to the emitters of transistors 34 and 36. The connection to the emitters of transistors 34 and 36 causes changes in the parameters of the circuit elements, for example by aging or underchanging temperature conditions, to be included in the variation of voltage at the summing point.

The decrease in voltage at summing point 50 causes a decrease in current through transistor 54. Transistor 54 serves also as a voltage comparator. Specifically, the voltage at the base of transistor 54 is compared to a reference voltage at the emitter of transistor 54. This reference voltage may be constant, variable with temperature, or variable with voltage or any combination thereof depending upon the particular application.

If the current through the collector-emitter circuit of transistor 54 decreases, the current flowing through resistors 58 and 59 increases. Transistor 60 becomes more conductive. The current through transistor 60 increases. This causes a decrease in the current through transistor 61. However, a decrease in the current through transistor 61 is equivalent to a reduction of the current supplied by the current source 25 to the difference amplifier having transistors 30 and 31. The decrease in current through the difference amplifier decreases the voltage drop across resistors 32 and 35 so that an increased DC voltage appears at the collectors of transistors 31 and 32 which opposes the previous decrease in the supply voltage.

An increase in the voltage at the bases of transistors 34 and 36 causes an increase in the current through the voltage dividers which furnish the base voltage to transistors 43 and 46. This in turn causes a decrease in the DC output voltage at the collectors of transistors 43 and 46.

If the Schmitt triggers described with reference to FIG. 1 are connected to the outputs of the difference amplifiers, the Schmitt triggers will remain in the blocked state of transistor $T_2$ over the whole supply voltage range. If the signals applied at the input of the difference amplifier have leading edges which have different directions, these differences in direction can be detected by means of the difference amplifier with the subsequent Schmitt triggers. In ignition systems in commercial vehicles, the undesired generation of a spark can be prevented while the supply voltage is being switched-in or switched-out. If for example, a switching transistor controlled by the Schmitt trigger is in a blocked state, it will remain in the blocked state while the supply voltage is being shut off so that a spark cannot be generated accidentally.

The circuits is so constructed that it is particularly suitable for embodiment in an integrated circuit.

Various changes and modifications may be made within the scope of the inventive concept.

We claim:

1. In a Schmitt trigger circuit having supply voltage furnishing means (8, 11,) for furnishing a supply voltage, an input amplifier element ($T_1$) connected to said supply voltage furnishing means, said input amplifier element having an input control circuit and an output control circuit, said output control circuit having a conductive and a nonconductive state in the absence and presence, respectively, of a switching signal applied to said input control circuit when said supply voltage is substantially equal to a nominal supply voltage, said output control circuit switching uncontrollably between said conductive and nonconductive state when said supply voltage decreases below a critical supply voltage substantially less than said nominal supply voltage, and an output amplifier element ($T_2$) connected to said input amplifier element and said supply voltage furnishing means, said output amplifier element having a conductive and nonconductive state when said input amplifier element has said nonconductive and conductive state, respectively:

apparatus for maintaining said output amplifier element in said nonconductive state in the absence of said switching signal independent of the value of said supply voltage throughout a predetermined supply voltage range extending from substantially zero supply voltage to said nominal supply voltage, said apparatus comprising first biasing means (9, 10, 12, $R_1$, $R_2$) connected to said input control circuit of said input amplifier element, for furnishing a DC voltage adapted to maintain said output control circuit in said conductive state in the absence of said switching signal throughout at least a first predetermined supply voltage range extending from said nominal supply voltage to said critical supply voltage;

and second biasing means ($R_3$, $R_5$, $R_6$) connected to said output amplifier element for maintaining said output amplifier element in said nonconductive state in the absence of said switching signal independent of said state of said output control circuit throughout a second predetermined supply voltage range extending from said critical supply voltage to substantially zero supply voltage, whereby uncontrolled switching of said output amplifier element during a supply voltage shutoff is prevented.

2. A system as set forth in claim 1, wherein said input and output amplifier elements are, respectively, an input and an output transistor, each having a base, emitter, and collector.

3. A system as set forth in claim 2, wherein said first biasing means comprises means for applying a DC voltage having a predetermined minimum amplitude ($V_E$) for keeping said output control circuit in said conductive state in the absence of said switching signal to said base of said input transistor.

4. Apparatus as set forth in claim 3, wherein said second biasing means comprises a voltage divider ($R_3$, $R_5$, $R_6$) having a voltage divider tap connected to said base of said output transistor.

5. A system as set forth in claim 4, wherein said means for furnishing a supply voltage comprises a first (8) and second (11) supply voltage line;
wherein said voltage divider comprises a first resistor connected between said first supply voltage line and said collector of said input transistor, a second resistor connected from said collector of said input transistor to said base of said output transistor, and a third resistor connected from said base of said output transistor to said second supply voltage line; and wherein $$R_6/(R_3+R_5+R_6)\cdot V_1 < VBET_2$$

where:
$R_3$ is said first resistor;
$R_5$ is said second resistor;
$R_6$ is said third resistor;
$VBET_2$ is the base-emitter voltage required for conduction of transistor $T_2$; and
$V_1$ is said critical supply voltage.

6. A system as set forth in claim 5, wherein said input transistor requires a predetermined switch-in base voltage for each value of said supply voltage for switching to said conductive state;
wherein said first biasing means further comprises an input voltage divider ($R_2$, $R_1$) connected to said supply voltage furnishing means and having a tap connected to said base of said input transistor, and wherein said means for applying a DC voltage to said base of said input transistor comprises means (10, 12) for applying a DC voltage raising the base voltage of said input transistor above said switch-in base voltage.

7. A system as set forth in claim 6, wherein the variation of said switch-in base voltage as a function of said supply voltage is a straight line having a slope a;
wherein said switching signal is applied between an input terminal (1) and said second supply voltage line;
wherein said input voltage divider comprises a first resistor ($R_2$) connected between said first supply voltage line and said base of said input transistor and a second resistor ($R_1$) connected between said base of said input transistor and said input terminal; and wherein:

$$R_1/(R_1+R_2)=a$$

where:
$R_1$ and $R_2$ are said second and first resistor of said input voltage divider, respectively.

8. A system as set forth in claim 1, further comprising a difference amplifier (21) connected to said Schmitt trigger circuit.

9. A system as set forth in claim 8, wherein said difference amplifier has a DC operating point varying as a function of changes in said supply voltage;
further comprising controllable current furnishing means (25) connected to said difference amplifier for maintaining said operating point constant, independent of changes in said supply voltage.

10. A system as set forth in claim 9, wherein said difference amplifier has a first stage (30, 31) and a second stage (43, 46);
further comprising impedance changing means (34, 36) connected between said first and second stage and having a first and second impedance changing output for furnishing a first and second difference signal, respectively;
summing circuit means (48, 49, 50) connected to said first and second output of said impedance changing means for summing said first and second difference signal thereby furnishing a summed signal;
and means (53) for applying said summed signal to said controllable current furnishing means.

11. A system as set forth in claim 10, wherein said second stage of said difference amplifier is connected to said means for furnishing said supply voltage through said impedance changing means.

12. A system as set forth in claim 11, wherein said summing circuit means further comprises means (51, 52) for furnishing a reference signal and comparing said reference signal to said summed signal prior to application to said controlled current furnishing means;
wherein said impedance changing means comprises a first and second transistor having a first and second emitter respectively;
wherein said second stage of said difference amplifier comprises a third and fourth transistor having a third and fourth collector, respectively;
further comprising a first series circuit having a first and second resistor (41, 42) connected between said first emitter and said third collector and a second series circuit having a third and fourth resistor (44, 45) connected between said second emitter and said fourth collector;
and wherein said summing circuit means has a first and second input connected to the common point of said first and second resistor, and said third and fourth resistor, respectively.

13. A system as set forth in claim 10, wherein said first stage of said difference amplifier comprises a first and second collector resistor (32, 35); and
wherein said first and second collector resistor are temperature varying resistors.

14. A system as set forth in claim 12, wherein said reference voltage applied to said summing circuit means varies as a function of temperature.

15. A system as set forth in claim 12, wherein said reference voltage applied to said summing circuit means is a voltage-varying reference voltage.

* * * * *